(12) United States Patent
Yagita

(10) Patent No.: US 7,423,276 B2
(45) Date of Patent: Sep. 9, 2008

(54) IRRADIATION SYSTEM WITH ION BEAM/CHARGED PARTICLE BEAM

(75) Inventor: Takanori Yagita, Ehime (JP)

(73) Assignee: Sen Corporation, An Shi and Axcelis Company, Tokyo (JP)

(*) Notice: Subject to any disclaimer, the term of this patent is extended or adjusted under 35 U.S.C. 154(b) by 178 days.

(21) Appl. No.: 11/202,102

(22) Filed: Aug. 12, 2005

(65) Prior Publication Data

US 2006/0113468 A1    Jun. 1, 2006

(30) Foreign Application Priority Data

Nov. 30, 2004    (JP) .............................. 2004-346783

(51) Int. Cl.
*G21K 5/10* (2006.01)

(52) U.S. Cl. .............................. 250/492.21; 250/492.1; 250/492.3; 250/396 R; 250/396 ML; 250/492.21; 250/400

(58) Field of Classification Search .... 250/492.1–492.3
See application file for complete search history.

(56) References Cited

U.S. PATENT DOCUMENTS

| 5,389,793 | A  | * | 2/1995  | Aitken et al.     | 250/492.21 |
| 6,835,930 | B2 | * | 12/2004 | Benveniste et al. | 250/298    |
| 7,276,711 | B2 | * | 10/2007 | Kawaguchi et al.  | 250/492.21 |
| 7,315,034 | B2 | * | 1/2008  | Yagita et al.     | 250/492.21 |

FOREIGN PATENT DOCUMENTS

| JP | 6-111759 A  | 4/1994  |
| JP | 10-302706   | 11/1998 |
| JP | 10-302707 A | 11/1998 |

\* cited by examiner

*Primary Examiner*—Jack I. Berman
*Assistant Examiner*—Andrew Smyth
(74) *Attorney, Agent, or Firm*—Arent Fox LLP

(57) ABSTRACT

In an irradiation system with an ion beam/charged particle beam, an ion beam/charged particle beam is deflected by an energy filter for the energy analysis and then a wafer irradiated with the beam. The energy filter controls the spread of magnetic field distribution caused by a deflection magnet, cancels a leakage magnetic field in the longitudinal direction, and bends the ion beam/charged particle beam at a uniform angle at any positions overall in scanning-deflection area.

6 Claims, 5 Drawing Sheets

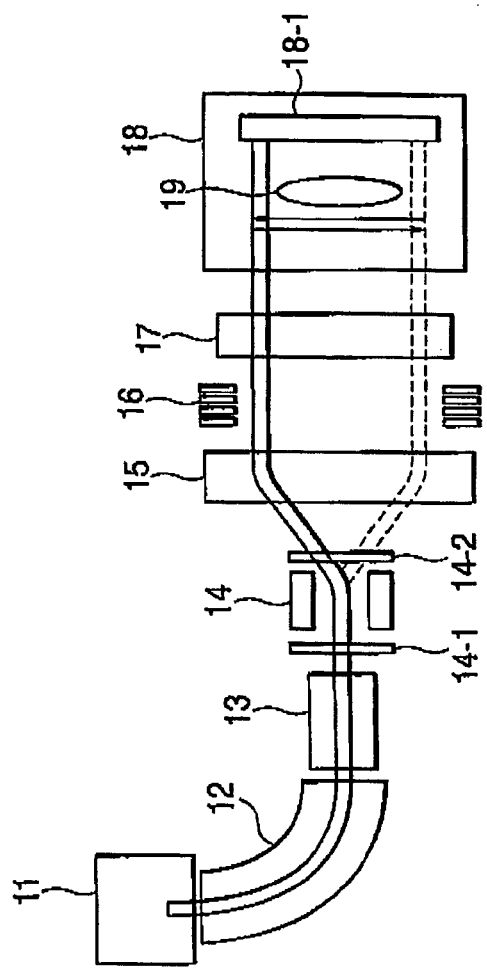
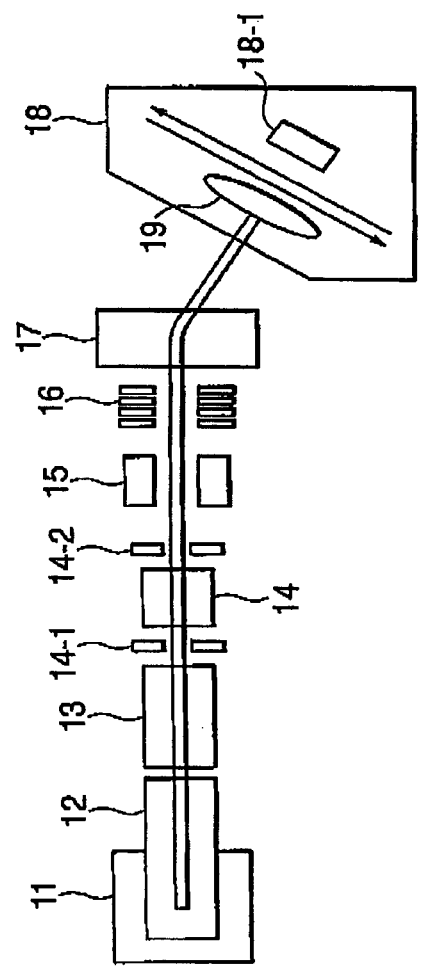
FIG. 1A
FIG. 1B

⊙⊗ :DIRECTION OF MAGNETIC FIELD

⊙⊗ :DIRECTION OF MAGNETIC FIELD

IRRADIATION SYSTEM WITH ION BEAM/CHARGED PARTICLE BEAM

This application claims priority to prior Japanese patent application JP 2004-34678, the disclosure of which is incorporated herein by reference.

BACKGROUND OF THE INVENTION

This invention relates to an irradiation system with an ion beam/charged particle beam and, in particular, relates to an energy filter for use therein.

An irradiation system with an ion beam/charged particle beam (also called an ion implantation system; hereinafter referred to simply as a "irradiation system with a beam") is a system for applying a mass analysis to ions or charged particles extracted from a beam source to thereby select only a necessary ion species or necessary charged particles and irradiating a wafer with the beam.

Among this type of irradiation systems with the beam, there is available one having, in addition to a mass analyzer, an energy filter called an angular energy filter (AEF) in order to more accurately implant ions or charged particles into a wafer.

The angular energy filter includes an analyzing electromagnet having a hollow-portion for passing an ion beam or a charged particle beam therethrough. The angular energy filter deflects the ion beam/charged particle beam passing through the hollow-portion of the analyzing electromagnet by a Lorentz force so as to irradiate the wafer with only those ions or charged particles each having a predetermined energy.

In order to cope with an increase in diameter of wafers in recent years, the irradiation range with a beam is required to be increased and, in order to satisfy such a requirement, the size of a hollow-portion of an analyzing electromagnet tends to be enlarged. When increasing the irradiation range with the beam, its cross-section is formed into an oval or ellipse that is long in one direction while short in a direction perpendicular thereto in order to make uniform the ion/charged particle density of the beam. Alternatively, the beam is reciprocatingly deflected for scanning along one direction in order to increase the irradiation range with the beam so that the beam has an oval, elliptical, or belt-shaped continuous cross-section. Accordingly, the shape of the hollow-portion of the analyzing electromagnet is normally rectangular and magnetic poles thereof are located at short sides of the rectangle. Therefore, as the hollow-portion of the analyzing electromagnet is enlarged, a gap between the magnetic poles becomes longer so that the spread of magnetic field distribution (leakage magnetic field) increases.

The irradiation system with the beam comprises a plasma shower device for suppressing charge-up of the wafer caused by irradiation with an ion beam. However, using the energy filter including the electromagnet with the large hollow-portion, there is a possibility that its leakage magnetic field gives bad influence to the wafer neutralization effect of charge-up suppression plasma shower electrons. Therefore, the leakage magnetic field of the energy filter should be cancelled.

Further, an implantation angle (irradiation angle) of the ion beam/charged particle beam with respect to the wafer should be constant regardless of an irradiation position with the beam. Specifically, the analyzing electromagnet is required to form a uniform magnetic field (where the BL product is constant. BL product, which is BL integral, a integrated magnetic flux density along the beam path.) on a path of the ion beam or charged particle beam so that the beam is deflected at the same angle wherever the beam passes within the hollow-portion of the analyzing electromagnet.

In a conventional energy filter using an analyzing electromagnet of which a gap between magnetic poles is narrow, using a field clamp for canceling a leakage magnetic field.

There is another conventional energy filter that uses a superconductive material for suppressing a leakage magnetic field. Such an energy filter is disclosed in, for example, JP-A-H06-111759.

On the other hand, as a conventional method of making uniform a magnetic field distribution produced in an opening (or hollow-portion) of an analyzing electromagnet, there is a method of winding a main coil at the center of a yoke and auxiliary coils on both sides thereof and adjusting a magnetic field generated by the main coil by the use of the auxiliary coils. Such a method is described in, for example, JP-A-H10-302706 or JP-A-H10-302707.

However, there is a problem that although the conventional method of suppressing the leakage magnetic field of the analyzing electromagnet by the use of the field clamp is suitable for the analyzing electromagnet having a small opening (or hollow-portion) with the narrow magnetic gap, it is insufficient for suppressing a leakage magnetic field from an analyzing electromagnet having a large opening (or hollow-portion).

Further, there is a problem that the conventional method of suppressing the leakage magnetic field by the use of the superconductive material is applied to a C-shaped magnet but is not applicable to an analyzing electromagnet having a hollow-portion at its center. In addition, there is also a problem that such a superconductive material suppresses a leakage magnetic field leaking to both inner and outer sides in beam bending radial directions but cannot suppress a leakage magnetic field in a longitudinal direction, i.e. a leakage magnetic field directed toward a wafer.

Moreover, there is a problem that the conventional method of uniforming the magnetic field distribution aims at only the magnetic field distribution in the opening (or hollow-portion) of the analyzing electromagnet but takes into account nothing about a leakage magnetic field.

SUMMARY OF THE INVENTION

An irradiation system with an ion beam/charged particle beam which is configured that the beam transformed by a beam transformer from a circular cross-section or an elliptical or oval cross-section to an elliptical or oval cross-section that is long in scanning direction after deflection for scanning, is subjected to an energy analysis by an energy filter, and then is incident on an irradiation target, wherein the energy filter bends the beam at a uniform angle at any positions overall in a scanning-deflection area thereof while controlling uniformly the spread of magnetic field distribution caused by a deflection magnet for turning out the uniform bending angle of the scanning-deflection beam.

According to the second aspect of this invention, in the irradiation system with ion beam/charged particle beam according to the first aspect, the deflection magnet comprises a plurality of main and secondary electromagnet coils installed on yokes so as to generate a uniform magnetic field in the one direction of the beam and performs magnetic field correction by adjusting the plurality of main and secondary electromagnet coils.

According to the third aspect of this invention, in the irradiation system with ion beam/charged particle beam according to the first or the second aspect, the deflection magnet comprises cancel correction coils which cancel leakage magnetic-field.

According to the fourth aspect of this invention, in the irradiation system with ion beam/charged particle beam according to the first or the second aspect, the deflection magnet comprises a main coil, a secondary coil, and a cancel correction coils which cancel leakage magnetic-field and provides uniformity of the BL product by balancing currents supplied to the coils.

According to the fifth aspect of this invention, in the irradiation system with ion beam/charged particle beam according to the fourth aspect, the uniformity of the BL product is installed by an aperture shape of each magnetic shields installed at upstream and downstream sides of the deflection magnet.

According to the sixth aspect of this invention, in the irradiation system with ion beam/charged particle beam according to any one of the first to the fifth aspects, the upper yoke of the deflection magnet is long in the longitudinal direction on an outer side of a bend of the beam while the lower yoke is long in a direction perpendicular to the longitudinal direction on an inner side of the bend of the beam and the deflection magnet is configured as an analyzing magnet having an almost sector shape.

According to the seventh aspect of this invention, in the irradiation system with ion beam/charged particle beam according to any one of the first to the sixth aspects, yokes of the deflection magnet are formed into a general window frame (quadrangular) shape having a hollow portion at its center and is configured that a beam line passes through the hollow portion.

According to the eighth aspect of this invention, there is installed an irradiation system with ion beam/charged particle beam which is configured that an ion beam/charged particle beam having a circular cross-section or an elliptical or oval cross-section that is long in one direction or an ion beam/charged particle beam deflected for scanning so as to have an elliptical or oval cross-section that is long in one direction, is subjected to an energy analysis by an energy filter and then is incident on an irradiation target, wherein cancel correction coils for canceling leakage magnetic-field are installed on both outer sides of yokes with secondary coils at its both side of the deflection magnet.

According to the ninth aspect of this invention, in the irradiation system with ion beam/charged particle beam according to the eighth aspect, the cancel correction coils for canceling leakage magnetic-field are installed on the sideward cores at its both side of the deflection magnet of the energy filter (at outer sides of the secondary coils).

According to the tenth aspect of this invention, in the irradiation system with ion beam/charged particle beam according to the eighth or ninth aspect, the cancel correction coils which cancel leakage magnetic-field are supplied with a current in a direction that cancels the leakage magnetic field.

According to the eleventh aspect of this invention, in the irradiation system with ion beam/charged particle beam according to any one of the eighth to tenth aspects, the cancel correction coils which cancel leakage magnetic-field are installed so as to cover both side of the yokes.

According to the twelfth aspect of this invention, in the irradiation system with ion beam/charged particle beam according to the first or the second aspect, cancel correction coils for canceling leakage magnetic-field are installed on outer sides of both ends of yokes of the deflection magnet, and a plasma shower is installed on a beam-line downstream side of the deflection magnet.

BRIEF DESCRIPTION OF THE DRAWINGS

FIGS. 1A and 1B are a plan view and a side view, respectively, showing a schematic structure of an irradiation system with an ion beam/charged particle beam according to an embodiment of this invention;

DESCRIPTION OF THE PREFERRED EMBODIMENT

Figure 2:
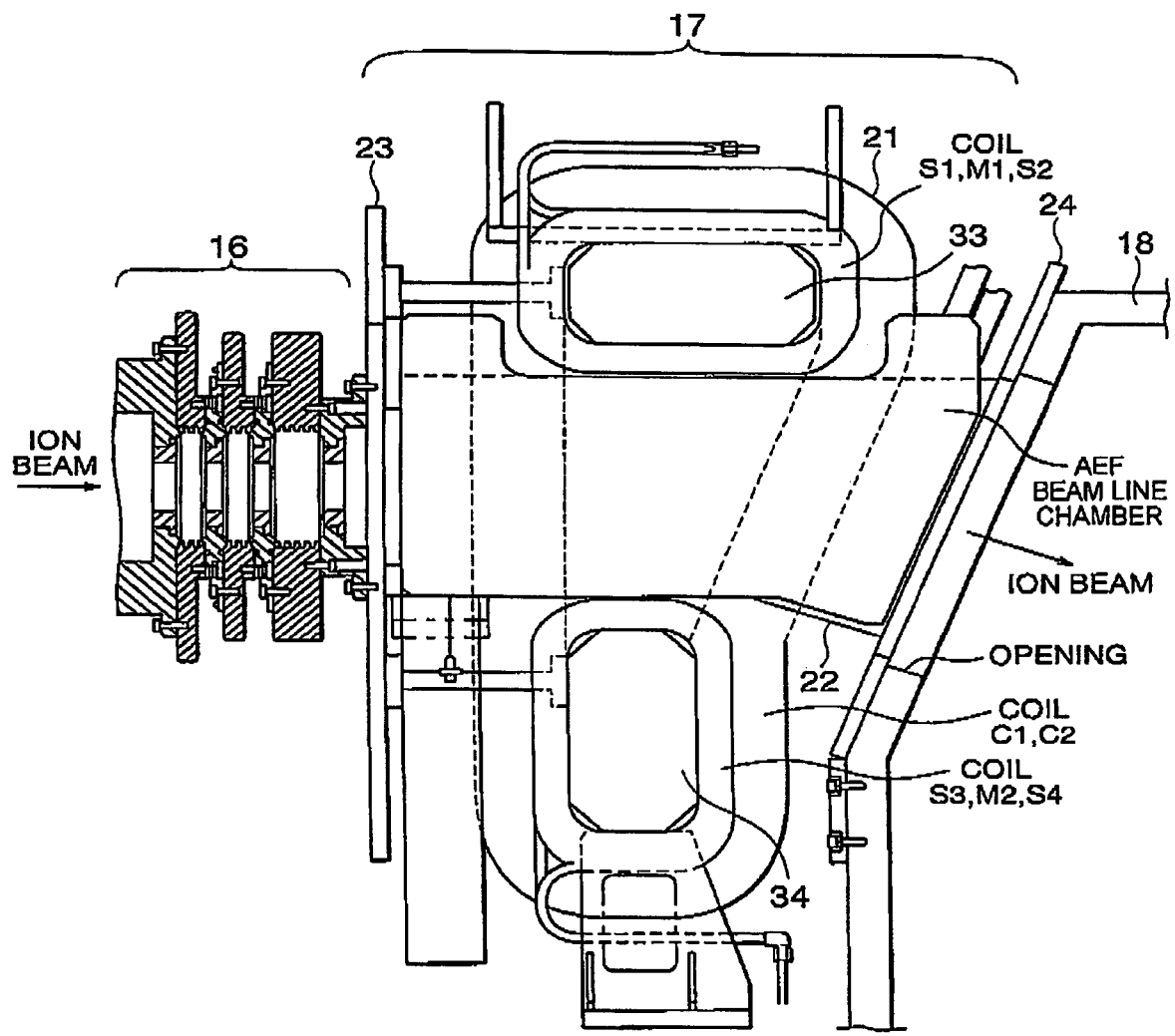
FIG. 2 is a cross-sectional view (side view) showing a structure of an angular energy filter included in the irradiation system with ion beam/charged particle beam shown in FIGS. 1A and 1B.

Now, the best mode for carrying out the invention will be described in detail with reference to the drawings.

FIGS. 1A and 1B are a plan view and a side view, respectively, showing a schematic structure of an irradiation system with an ion beam/charged particle beam (hereinafter abbreviated as a "irradiation system with beam") according to an embodiment of this invention.

The illustrated irradiation system with a beam comprises an ion source 11, a mass analysis magnet device 12, a beam transformer 13, a deflector for scanning 14, a P (Parallelizing)-lens 15, acceleration/deceleration electrodes (in an A/D columns) 16, an angular energy filter (AEF) 17, and a process vacuum chamber 18.

In this irradiation system with a beam, ions or charged particles generated in the ion source 11 are extracted through extraction electrodes (not illustrated) as an ion beam or a charged particle beam (hereinafter referred to as a "beam"). The extracted beam is subjected to a mass analysis in the mass analysis magnet device 12 so that only a predetermined ion species is selected. The beam composed of only the predetermined ion species is transformed in cross-section by the beam transformer 13. The beam transformer 13 is composed of Q (Quadrupole)-lenses and so on. The beam having the adequate cross-sectional shape is swung reciprocally in the direction perpendicular to the center orbit in FIG. 1A by the deflector for scanning 14. The deflector for scanning 14 has electron suppression electrodes 14-1 and 14-2 that are installed at the upstream and downstream sides of the deflector for scanning 14, respectively. Although deflection electrodes for scanning are used as the deflector for scanning 14 in this embodiment, a deflection magnet for scanning may be used in place of them.

The beam swung reciprocally by the deflector for scanning 14 is parallelized by the P-lens 15 formed by electrodes or a magnet so that all the swung orbits are parallel to a scan-center axis of a deflection angle of zero degree. In FIG. 1A, a swing range of the beam by the deflector for scanning 14 is indicated by a thick black line and double broken lines. The beam from the P-lens 15 is accelerated or decelerated by one or more acceleration/deceleration electrodes 16 and sent to the angular energy filter 17. The angular energy filter 17 performs an analysis about energy of the beam to thereby select only an ion-species having a predetermined energy. As shown in FIG. 1B, only the selected ion species with a selected energy is deflected correctly downward by the angular energy filter 17. The wafer 1 is irradiated with the beam composed only of thus selected ion species being introduced in the process vacuum chamber 18 as an irradiation target. The beam that is not incident on the wafer 19 is injected into a beam stopper 18-1 provided in the process vacuum chamber 18 so that energy thereof is consumed.

In FIG. 1A, arrows shown adjacent to the wafer 19 represent that the beam is deflected for scanning in the directions of these arrows (horizontal direction), while, in FIG. 1B, arrows shown adjacent to the wafer 19 represent that the wafer 19 itself is moved in directions of these arrows (vertical direction). Specifically, assuming that the wafer is reciprocally scanned with the beam, for example, x-axis directions, the wafer 19 is also moved reciprocally by a drive mechanism (not illustrated) so as to be irradiated uniformly also in y-axis directions perpendicular to the x-axis directions. This enables the target wafer 19 to be irradiated with the beam over the whole surface uniformly.

In the manner as described above, in the irradiation system with the beam shown in FIGS. 1A and 1B, a beam having an elliptical or oval cross-section that is long in scanning direction (horizontal direction in FIG. 1A) can be obtained and then bent at a uniform angle at any positions overall in a scanning-deflection area thereof by the use of the angular energy filter serving as an energy filter so that the wafer is irradiated with the beam with the uniform incident angle.

Referring now to FIGS. 2 to 6, description will be given in detail about the angular energy filter 17 used in the irradiation system with the beam according to this embodiment.

As shown in FIG. 2, the angular energy filter 17 comprises an analyzing electromagnet 21, an AEF (beam line) vacuum chamber 22 inserted and installed in a hollow portion located substantially at the center of the analyzing electromagnet 21, and magnetic shields 23 and 24 respectively installed at a beam injecting side (upstream side) and a beam outgoing side (downstream side) of the AEF vacuum chamber 22. The angular energy filter 17 is fixedly installed between the acceleration/deceleration electrodes 16 and the process vacuum chamber 18 such that the magnetic shield 23 is fixed to the acceleration/deceleration electrodes 16 while the magnetic shield 24 is fixed to the process vacuum chamber 18.

Figure 3:
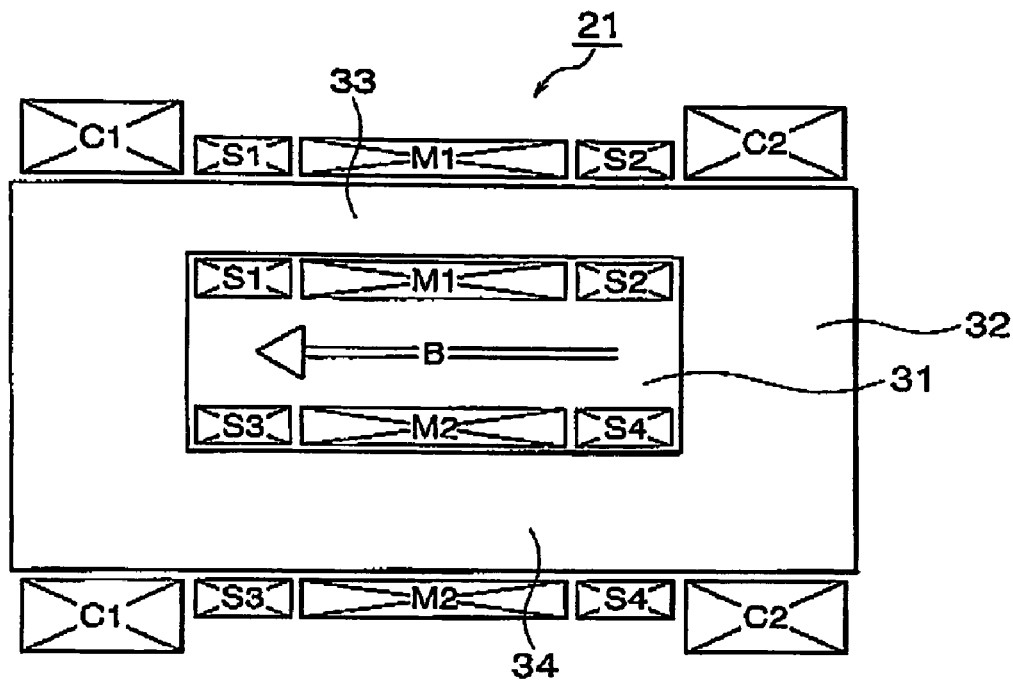
FIG. 3 is a cross-sectional view (front view) showing a structure of an analyzing electromagnet used in the angular energy filter shown in FIG. 2.

FIG. 3 is a cross-sectional view showing a structure of the analyzing electromagnet 21. As shown in FIG. 3, the analyzing electromagnet 21 comprises a generally quadrangular (window frame type) core 32 formed at its center portion with a rectangular hollow portion (opening) 31 for passing the beam therethrough. First and second main coils M1 and M2 are respectively wound on an upper yoke 33 and a lower yoke 34, each forming part of the core 32, at the centers thereof. Further, first and second secondary coils S1 and S2 are wound around the upper yoke 33 on both sides of the main coil M1 and third and fourth secondary coils S3 and S4 are wound around the lower yoke 34 on both sides of the main coil M2. Moreover, cancel correction coils C1 and C2 are wound on the core 32 outside the secondary coils S1 to S4 so as to cover both side edges of the upper and lower yokes 33 and 34 and side yokes.

Figure 4:
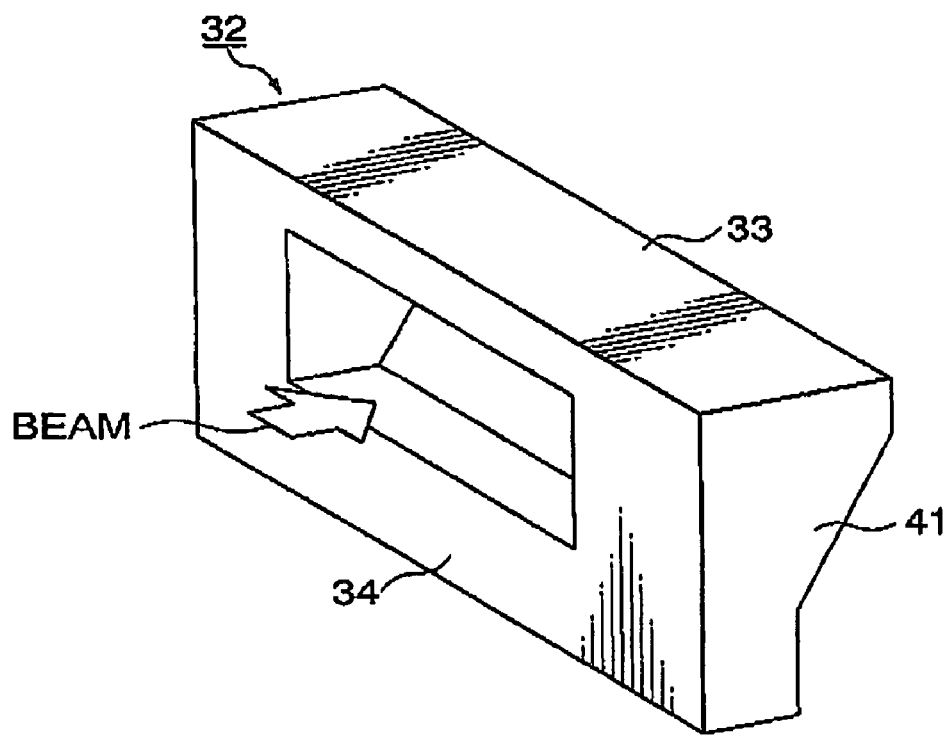
FIG. 4 is a perspective view of a core used in the analyzing electromagnet shown in FIG. 3.

As illustrated in FIG. 4, the upper yoke 33 has a cross-sectional shape that is long in the beam advancing direction (longitudinal direction) depicted by an outline arrow, while the lower yoke 34 has a cross-sectional shape that is long in a direction perpendicular to the beam advancing direction (vertical direction, i.e. upward/downward direction in FIG. 4). Each side 41 of the core has an almost sector shape that is wide on the side of the upper yoke 33 while narrow on the side of the lower yoke 34. Normally, the core 32 is subjected to chamfering for protecting the coils (see FIG. 2).

Referring back to FIG. 3, the main coils M1 and M2, the secondary coils S1 to S4, and the cancel correction coils C1 and C2 are wound on the upper and lower yokes 33 and 34 and connected to power supplies (not illustrated) so as to form a magnetic field in the hollow portion 31 in a direction identified by an arrow B. The main coils M1 and M2 and the secondary coils S1 to S4 are mainly used for generating a magnetic field that serves to bend the beam, while the cancel correction coils C1 and C2 are used for canceling a leakage magnetic field therefrom.

Specifically, the main coils M1 and M2 are connected in series to each other and connected to a first DC power supply (not illustrated) so as to generate a magnetic field inside the upper and lower yokes 33 and 34 in a direction opposite to the arrow B. Further, like the main coils M1 and M2, the secondary coils S1 to S4 are connected in series to each other and connected to a second DC power supply (not illustrated) so as to generate a magnetic field inside the upper and lower yokes 33 and 34 in the direction opposite to the arrow B. On the other hand, the cancel correction coils C1 and C2 are connected in series to each other and connected to a third DC power supply (not illustrated) so as to generate a magnetic field inside both side portions (including portions serving as magnetic poles) of the core 32 in the same direction as the arrow B. In the case where all the coils are wound in the same direction, the main coils M1 and M2 and the secondary coils S1 to S4 are supplied with currents in the same direction from the first and second DC power supplies, while the cancel correction coils C1 and C2 are supplied with a current in a direction opposite thereto from the third DC power supply.

Figure 5A:
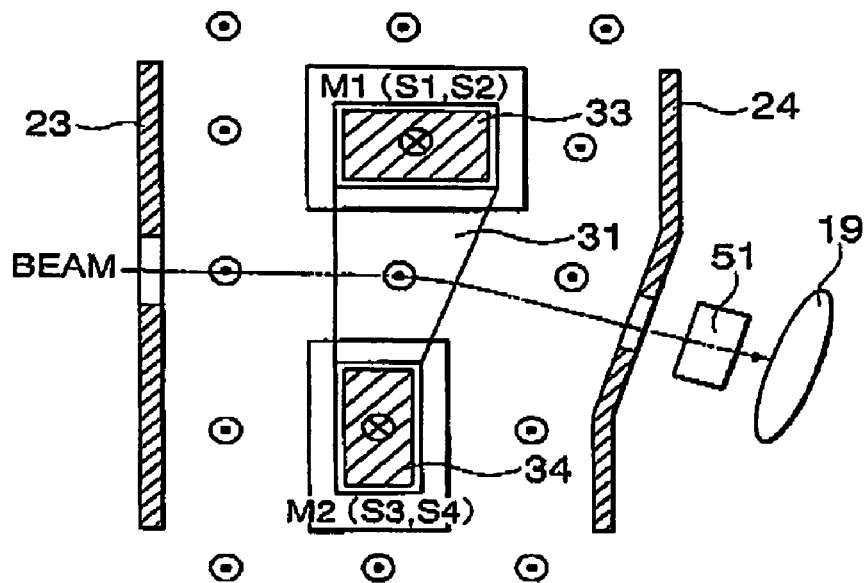
FIG. 5A is a diagram showing directions of a magnetic field generated by main coils M1 and M2 (or secondary coils S1 and S3, or S2 and S4) of the analyzing electromagnet shown in FIG. 3.
Figure 5B:
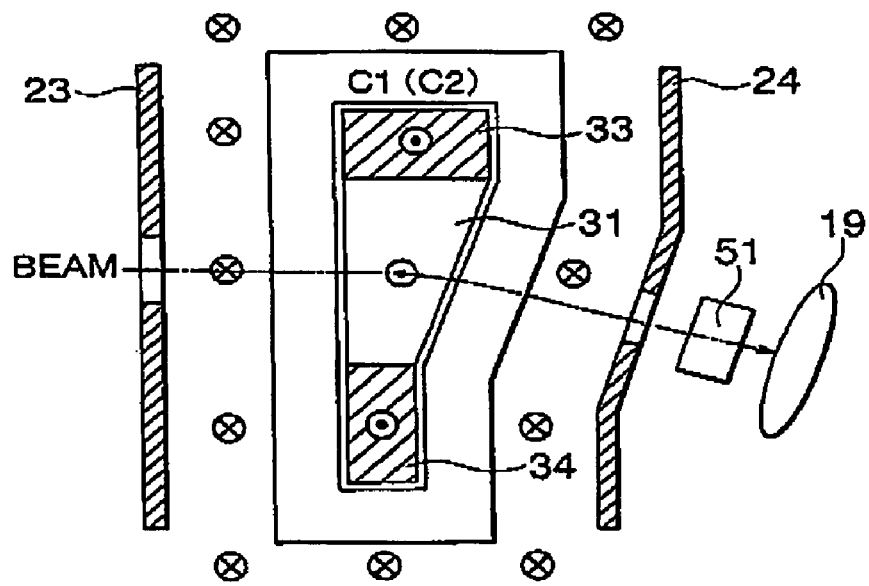
FIG. 5B is a diagram showing directions of a magnetic field generated by cancel correction coils C1 and C2.

FIG. 5A shows the directions of the magnetic field generated by the main coils M1 and M2 (or the secondary coils S1 and S3, or S2 and S4), while FIG. 5B shows the directions of the magnetic field generated by the cancel correction coils C1 and C2.

In FIGS. 5A and 5B, a plasma shower device 51 is installed between the magnetic shield 24 on the beam outgoing side (downstream side) and the target wafer 19.

As understood from a comparison between FIGS. 5A and 5B, the magnetic field generated in the hollow portion 31 of the analyzing electromagnet 21 by the main coils M1 and M2 and the magnetic field generated also in the hollow portion 31 by the cancel correction coils C1 and C2 have the same direction. However, the magnetic field generated around the analyzing electromagnet 21 by the main coils M1 and M2 and the magnetic field generated around the analyzing electromagnet 21 by the cancel correction coils C1 and C2 have the opposite directions. Therefore, by properly controlling (balancing) the currents supplied to the respective coils, it is possible to form a uniform magnetic field having a desired magnetic flux density in the hollow portion 31 of the analyzing electromagnet 21 and further cancel the magnetic fields each other that are generated around the analyzing electromagnet 21. That is, by controlling the current supplied to the cancel correction coils C1 and C2, it is possible to control the spread of magnetic field distribution to thereby suppress the leakage magnetic field. Further, by adjusting the currents supplied to the main coils M1 and M2, the secondary coils S1 to S4, and the cancel correction coils C1 and C2, it is possible to generate a uniform magnetic field distribution where the beam is bent (or deflected) at the same deflection angle regardless of where the beam passes in the hollow portion 31, i.e. a magnetic field where the BL product is uniform. Thus, the analyzing electromagnet 21 bends or deflects the beam at a uniform angle at any positions overall in a scanning-deflection area thereof.

Figure 6A:
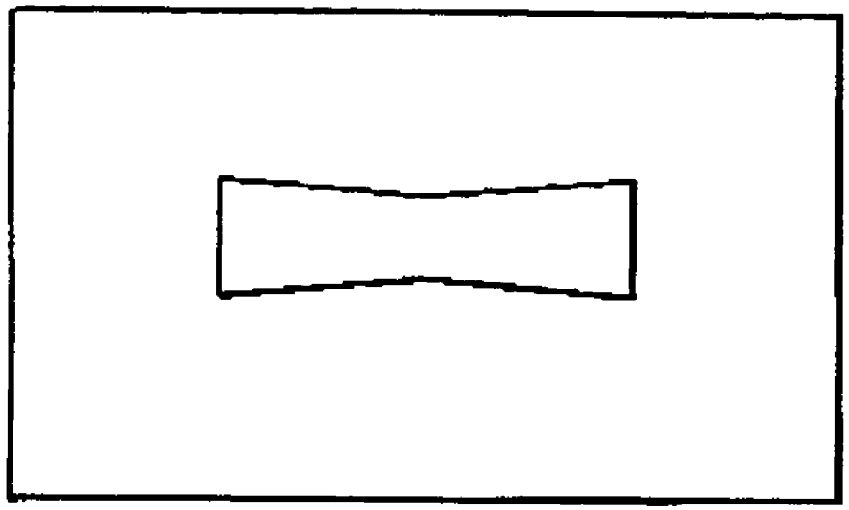
FIGS. 6A and 6B are diagrams each showing an example of a shape of an aperture of each of magnetic shields used in the angular energy filter shown in FIG. 2.
Figure 6B:
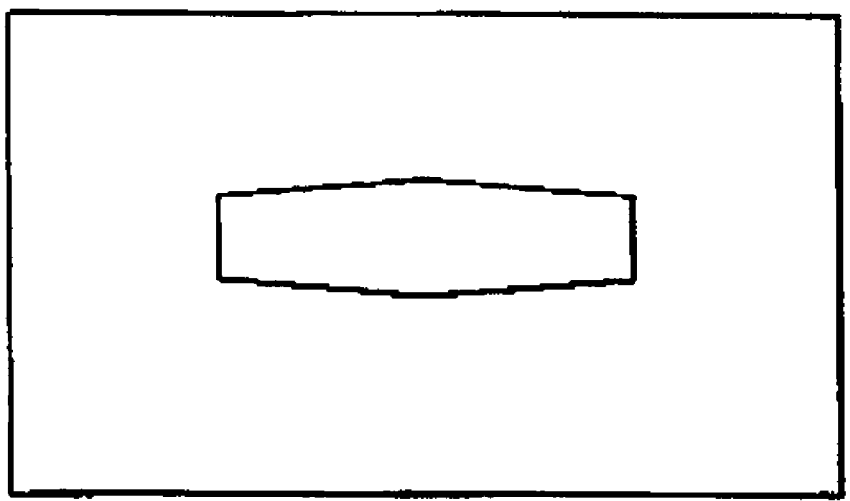

The magnetic shields 23 and 24 adjust the magnetic field distribution and facilitate the adjustment of the currents supplied to the respective coils for achieving the same deflection angle of the beam regardless of a beam passing position in the hollow portion 31. That is, the magnetic shields 23 and 24 facilitate realizing the magnetic field distribution where the BL product is uniform. The adjustment of the magnetic field distribution by the magnetic shields 23 and 24 is carried out by determining the shape of an opening (aperture) of each magnetic shield depending on an ion species, a beam cross-sectional shape (e.g. circular, oval, elliptical, or the like), a scan range, an implantation energy, and so on. As the aperture shape of the magnetic shields 23 and 24, there is, for example, rectangular or a shape as shown in FIG. 6A or 6B. The opening (aperture) shape of the magnetic shield 23 and that of the magnetic shield 24 are normally the same as each other. However, as understood from FIG. 2 or FIGS. 5A and 5B, the cross-sectional shape of the magnetic shield 23 is linear while that of the magnetic shield 24 is bent (or deflected) corresponding to the shape of the analyzing electromagnet 21.

By the use of the energy filter as described above, the irradiation system with the beam according to this embodiment can uniformly bend the whole of the beam while controlling the spread of magnetic field distribution caused by the deflection magnet. That is, this irradiation system with the beam can uniformly bend the beam, passing in the hollow portion of the analyzing electromagnet, over the whole thereof regardless of the cross-sectional shape of the beam, the beam scan range, and the beam passing position in the hollow portion and irradiate (implant) the beam onto the target wafer. Further, since the cancel correction coils are installed on the outer sides of both end portions of the yokes of the deflection magnet, the leakage magnetic field can be suppressed. With this arrangement, electrons from the plasma shower device are irradiated onto the target wafer without being affected by the leakage magnetic field so that the charge-up of the wafer can be neutralized.

What is claimed is:

1. An irradiation system with an ion beam/charged particle beam which is configured that the beam subjected to a mass analysis using a mass analysis magnet device and transformed by a beam transformer to an elliptical or oval cross-section that is long in one direction, is subjected to an energy analysis by an energy filter, and then is incident on an irradiation target, wherein said energy filter comprises a deflection magnet which comprises a general window-frame shaped core, main electromagnet coils and cancel correction coils, said frame-shape core including an upper yoke, a lower yoke and side yokes connected between said upper yoke and said lower yoke to form a hollow portion, said main electromagnet coils wound on said upper and said lower yokes to be perpendicular to a longitudinal direction of said upper and said lower yokes with passing through the hollow portion and to form a magnetic-filed in the hollow portion, said cancel correction coils wound on said side yokes to be perpendicular to the longitudinal direction of said upper and said lower yokes without passing through the hollow portion and to cancel leakage magnetic-filed.

2. An irradiation system with ion beam/charged particle beam according to claim 1, wherein said deflection magnet further comprises secondary electromagnet coils which are lining up at both side of each of said main electromagnetic coils, and these coils are installed on said each of said upper and lower yokes, so as to generate a uniform magnetic field in said one direction of said beam and performs magnetic field correction by adjusting said main and secondary electromagnet coils.

3. An irradiation system with ion beam/charged particle beam according to claim 2, wherein said a secondary electromagnet coils are wound on said upper and lower yokes at both sides of said main electromagnet coils so as to bend said beam at a uniform angle at any positions overall in the hollow portion and provides uniformity of BL product by balancing currents supplied to said main and secondary electromagnet coils.

4. An irradiation system with ion beam/charged particle beam according to claim 3, wherein said uniformity of the BL product is improved by an aperture shape of each magnetic shields installed at upstream and downstream sides of said deflection magnet.

5. An irradiation system with ion beam/charged particle beam according to any one of claims 1, 2, 3 and 4, wherein said cancel correction coils which cancel leakage magnetic-field are supplied with a current in a direction that cancels the leakage magnetic field.

6. An irradiation system with ion beam/charged particle beam according to any one of claims 1, 2, 3 and 4, wherein a plasma shower is installed on a beam-line downstream side of said deflection magnet.

* * * * *